United States Patent [19]
Gardner et al.

[11] Patent Number: 5,977,602
[45] Date of Patent: Nov. 2, 1999

[54] SEMICONDUCTOR DEVICE HAVING AN OXYGEN-RICH PUNCHTHROUGH REGION EXTENDING THROUGH THE LENGTH OF THE ACTIVE REGION

[75] Inventors: Mark I. Gardner, Cedar Creek; H. Jim Fulford, Austin, both of Tex.

[73] Assignee: Advanced Micro Devices, Austin, Tex.

[21] Appl. No.: 08/995,076

[22] Filed: Dec. 19, 1997

[51] Int. Cl.⁶ ................................................. H01L 29/54
[52] U.S. Cl. .......................... 257/438; 257/344; 257/336; 257/337; 257/338; 257/361; 257/362; 257/363; 257/497; 257/498
[58] Field of Search ..................................... 257/361–363, 257/26, 344, 345, 408, 655, 336–338, 914, 607, 438, 460, 497, 498; 438/196

[56] References Cited

U.S. PATENT DOCUMENTS 5,418,375  5/1995  Hoskins et al. ........................... 257/26
5,514,902  5/1996  Kawasaki et al. ....................... 257/344

*Primary Examiner*—Fetsum Abraham
*Attorney, Agent, or Firm*—Merchant & Gould P.C.

[57] ABSTRACT

A semiconductor device having an oxygen-rich punchthrough region under the channel region, and a process for fabricating such a device are disclosed. In accordance with one embodiment, a semiconductor device is formed by forming an oxygen-rich punchthrough region in a substrate, and forming a channel region over the oxygen-rich punchthrough region. The use of an oxygen-rich punchthrough region may, for example, inhibit the diffusion of dopants used in forming the channel region.

20 Claims, 3 Drawing Sheets

SEMICONDUCTOR DEVICE HAVING AN OXYGEN-RICH PUNCHTHROUGH REGION EXTENDING THROUGH THE LENGTH OF THE ACTIVE REGION

FIELD OF THE INVENTION

The present invention is directed generally to semiconductor devices and, more particularly, to a semiconductor device having an oxygen-rich punchthrough region and a process for fabricating such a device.

BACKGROUND OF THE INVENTION

Over the last few decades, the electronics industry has undergone a revolution by the use of semiconductor technology to fabricate small, highly integrated electronic devices. The most common and important semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. A punchthrough region 111 is typically formed beneath the channel region 107. The punchthrough region 111 is typically moderately doped with a dopant of a type opposite to that of the source/drain regions 105.

The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

The source/drain regions 105, illustrated in FIG. 1, are lightly-doped-drain (LDD) structures. Each LDD structure includes a lightly-doped, lower conductivity region 106 near the channel region 107 and a heavily-doped, higher conductivity region 104 typically connected to the source/drain terminal. Generally, the LDD structures are typically formed by implanting a first dopant into active regions adjacent the gate electrode 103 at relatively low concentration levels to form the lightly-doped regions 106; forming spacers 102 on sidewalls of the gate electrode 103; and implanting a second dopant into the active regions at higher concentration levels to form the heavily-doped regions 104. The substrate is typically annealed to drive the dopant in the heavily-doped regions deeper into the substrate 101.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET). Semiconductor devices, like the one described above, are used in large numbers to construct most modern electronic devices.

The punchthrough region 111 plays an important role in the operation of a semiconductor device by reducing unwanted current flow between the source and the substrate 101, typically when the gate voltage is below the threshold voltage. The punchthrough region 111 is typically formed by implanting a dopant of the opposite conductivity type as that of the source/drain region 105. The punchthrough implant is typically performed before forming the gate insulating layer 109, and is typically implanted to a depth ranging from about 300 to 1,500 Å.

SUMMARY OF THE INVENTION

Generally, the present invention relates to a semiconductor device having an oxygen-rich punchthrough region under the channel region, and a process for fabricating such a device. The use of an oxygen-rich punchthrough region may, for example, inhibit the diffusion of dopants used in forming the channel region.

In accordance with one embodiment of the invention, a semiconductor device is formed by forming an oxygen-rich punchthrough region in a substrate, and forming a channel region over the oxygen-rich punchthrough region.

The above summary of the present invention is not intended to describe every incrementation of the present invention. The figures and the detailed description which follow exemplify the embodiments more particularly.

BRIEF DESCRIPTION OF THE DRAWINGS

The invention may be more completely understood in consideration of the detailed description of the preferred embodiment of the invention in connection with the accompanying drawings, in which.

Figure 1:
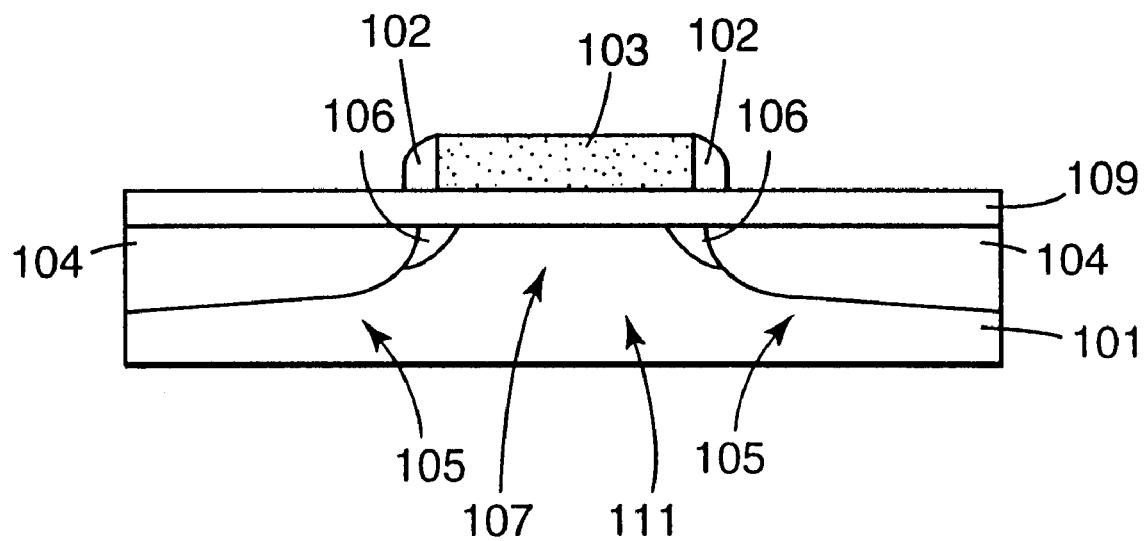
FIG. 1 is a typical MOS transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices, including in particular MOS, CMOS, and BiCMOS structures. While the present invention is not so limited, an appreciation of various aspects of the invention will be gained through a discussion of the fabrication process and characteristics of such a device in connection with the examples provided below.

Figure 2A:
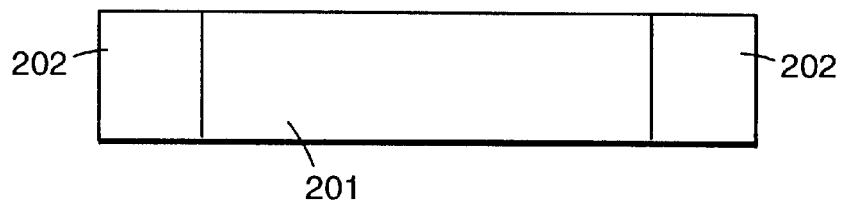
FIGS. 2A–2D illustrate an exemplary process in accordance with one embodiment of the invention.

FIGS. 2A–2D illustrate an exemplary process for fabricating a semiconductor device with an oxygen-rich punchthrough region under a channel region. In accordance with this exemplary process, isolation regions 202 may be formed in a substrate 201, as illustrated in FIG. 2A. The isolation regions 202 may be formed using, for example, well-known LOCOS or trench isolation techniques. The isolation regions 202 are used to separate active areas (only one of which is shown) in which active devices, such as transistors, are formed. After forming the isolation regions, a well implant may be performed to form well regions in the substrate 201. The well implants are typically performed using a dopant of a conductivity type opposite to that of the substrate. The well implant may be performed using, for example, well-known techniques. The well regions are typically used to enable the fabrication of, for example, both PMOS and NMOS devices on the same substrate. Typically, the devices of one type are formed in the well regions and the devices of another type are formed outside of the well regions.

Figure 2B:
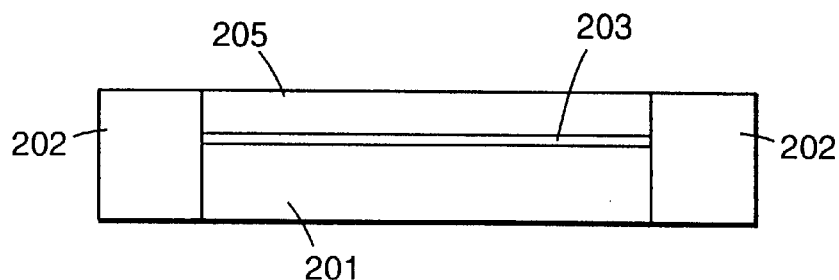

An oxygen-rich punchthrough region 203 is formed in the substrate 201, as shown in FIG. 2B. The oxygen-rich punchthrough region 203 may be formed, for example, by implanting an oxygen-bearing species in the substrate 201. Suitable oxygen-bearing species include O or $O_2$, for example.

A channel region will be formed over the oxygen-rich punchthrough region 203. The oxygen-rich punchthrough region 203 will be used to inhibit diffusion of dopants used to form the channel region and generally confine the channel dopants between the oxygen-rich punchthrough region 203 and the substrate surface.

The implant energy is chosen depending on the oxygen-bearing species and on the desired depth of the oxygen-rich punchthrough region 203. Suitable depths of the oxygen-rich punchthrough region 203 range from about 300 to 1,500 Å for many applications. Suitable implant energies for oxygen range from about 50 to 250 keV for many applications. Suitable implant energies for an $O_2$ implant range from about 100 to 500 keV for many applications. The concentration of the implanted oxygen-bearing species is chosen depending on the desired concentration of the oxygen-rich punchthrough region 203. For example, an oxygen-bearing species, such as O or $O_2$, may be implanted with a concentration ranging from about 5E12 to 5E15 atoms/cm$^2$ (i.e. $5 \times 10^{12}$ to $5 \times 10^{15}$ atoms/cm$^2$).

The oxygen-bearing species implant generally forms an oxygen-rich region in the substrate. The oxygen-rich region 203 may be an oxide region depending on the implant dosage. For example, at lower dosages (e.g., 5E13 atoms/cm$^2$ or less) typically little or no oxide region is formed. At these dosage levels, the oxygen-bearing layer 203 remains mildly conductive. At higher dosages (e.g. 5E13 atoms/cm$^2$ and above) the oxygen-rich region becomes increasingly an oxide, such as silicon dioxide, region. As the oxide content of the region 203 increases, the conductive nature of the region 203 falls dramatically.

A lightly-doped region 205 is formed over the oxygen-rich punchthrough region 203, as shown in FIG. 2B. Portions of the lightly-doped region 205 will be used to form a channel region over the oxygen-rich punchthrough region 203. The lightly-doped region 205 is typically formed by implanting a dopant of the opposite conductivity type than that of the active region dopant. The lightly-doped region 205 and the associated implant are commonly referred to as a threshold voltage region and a threshold voltage implant respectively.

Figure 2C:
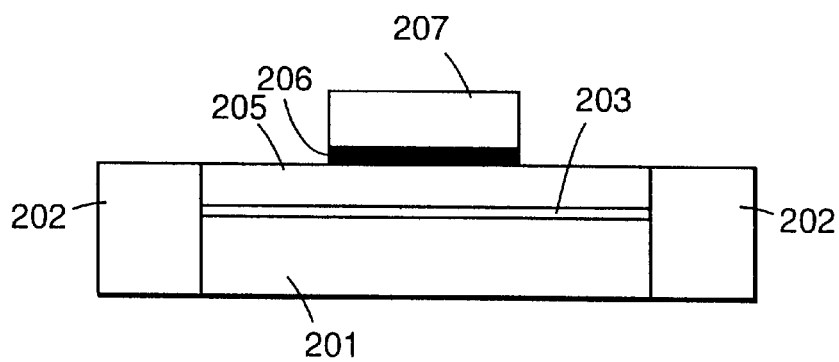

A gate electrode 207 is formed over the substrate 201 after forming the oxygen-rich punchthrough region 203 and the lightly-doped region 205, as illustrated in FIG. 2C. The gate electrode 207 is typically separated from the substrate 201 by a gate insulating layer 206, such as an oxide layer, for example. It should be appreciated that the gate electrode structure depicted in FIG. 2C may be formed using a number of different known techniques.

Figure 2D:
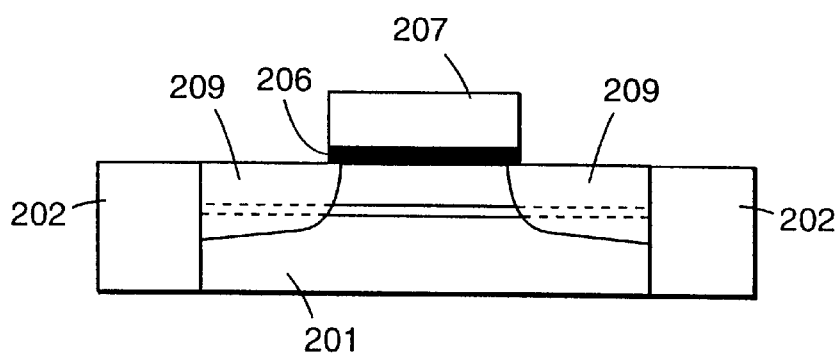

Active regions 209 may are formed in the substrate 201, adjacent the gate electrode 207, as illustrated in FIG. 2D. The active regions 209 may, for example, be LDD (lightly-doped-drain) source/drain regions. An LDD source/drain region may be formed by making two implants in the substrate 201. Typically, the first implant is a low dose, low energy implant of a dopant (of a conductivity type opposite that of the channel region), and the second implant is a heavy dose, higher energy implant of a similar-type or the same dopant. The first dose is typically implanted into the substrate 201 when the semiconductor device has the configuration shown in FIG. 2C. Before the second dose is implanted, spacers (not shown) are formed on sidewalls of the gate electrode 207. The spacers are used to space the second dopant implant from the gate electrode 207 and the channel region below the gate electrode 207. The dopant implants, as well as spacer formation, may be done using well-known techniques.

The conductivity type of the dopant(s) used to form the active regions 209 depends on the type (e.g. NMOS or PMOS) of device being formed. For example, in an NMOS transistor the source/drain regions are formed by implanting an n-type dopant, such as arsenic or phosphorus. Correspondingly, in an PMOS transistor the source/drain regions are formed by implanting a p-type dopant, such as boron. The junction depth of the active region 209 will depend on the depth of the heavy dose dopant implant as well as the depth and type of oxygen-rich region 203. For example, when the oxygen-rich region 203 is substantially an oxide, the active region junction depth will be defined by the oxygen-rich region 203. With a mildly conductive oxygen-rich region 203 (e.g., one formed at dosage less than about 5E13 atoms/cm$^2$) the active region junction depth may be deeper than within, or at the interface of the oxygen-rich region 203. In either event, the oxygen-rich region 203 will serve to inhibit diffusion of the active region dopant.

After forming the active regions 209, the substrate 201 is typically heated to activate the dopants in the active regions 209 and to drive the dopants deeper into the substrate 201. The substrate 201 may be heated using, e.g., well-known anneal techniques such as rapid thermal anneal (RTA). During this heating, the dopants in the active regions 209 as well as the channel dopants tend to diffuse further into the substrate 201. However, the oxygen-rich punchthrough region 203 will advantageously act to inhibit this diffusion.

Using the above process, a semiconductor device can be fabricated having an oxygen-rich punchthrough region. The use of an oxygen-rich punchthrough region can, for example, inhibit the diffusion of channel dopants. This can, for example, increase the drive current of the transistor. The oxygen-rich punchthrough region may also, for example, inhibit the flow of leakage currents from the channel region.

Figure 3A:
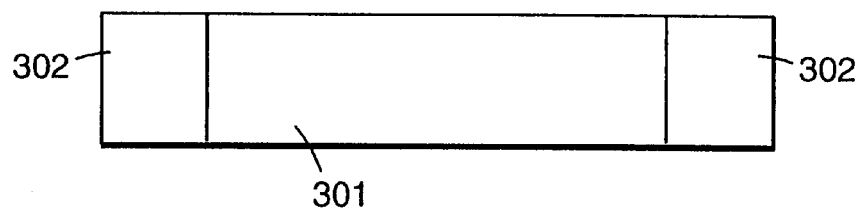
FIGS. 3A–3D illustrate an exemplary process in accordance with another embodiment of the invention.

FIGS. 3A–3D illustrate another exemplary process for fabricating a semiconductor device with an oxygen-rich punchthrough region under the channel region, and oxygen-rich liners under the active regions. In accordance with this process, isolation regions 302 and well regions (not shown) are formed in a substrate 301, as illustrated in FIG. 3A. The isolation regions 302 and well regions may be formed in a similar manner as discussed above.

Figure 3B:
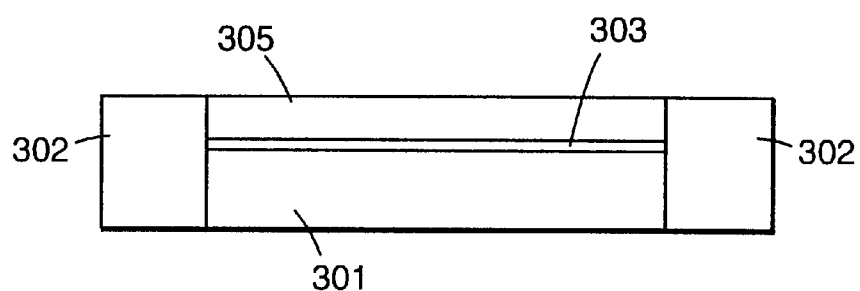

An oxygen-rich punchthrough region 303 is formed in the substrate 301, as shown in FIG. 3B. The oxygen-rich punchthrough region 303 may be formed, for example, by implanting an oxygen-bearing species in the substrate 301. Suitable oxygen-bearing species include O or $O_2$, for example. A channel region will be formed over the oxygen-rich punchthrough region 303. The oxygen-rich punchthrough region 303 will be used to inhibit diffusion of dopants used to form the channel region and generally confine the channel dopants between the oxygen-rich punchthrough region 303 and the substrate surface.

The implant energy is chosen depending on the oxygen-bearing species and on the desired depth of the oxygen-rich punchthrough region 303. Suitable depths of the oxygen-rich punchthrough region 303 range from about 0.03 to 0.05 microns for many applications. Suitable implant energies for oxygen range from about 50 to 250 keV for many applications. Suitable implant energies for an $O_2$ implant range from about 100 to 500 keV for many applications. The concentration of the implanted oxygen-bearing species is chosen depending on the desired concentration of the oxygen-rich punchthrough region 303. For example, a low dose of an oxygen-bearing species, such as O or $O_2$, may be implanted with a concentration ranging from about 5E12 to 5E13 atoms/$cm^2$. At these dosages the region 303 will remain mildly conductive.

A lightly-doped region 305 is formed in the substrate 301, as illustrated in FIG. 3B. Portions of the lightly-doped region 305 will be used to form a channel region over the oxygen-rich punchthrough region 303. The lightly-doped region 305 and the associated implant are commonly referred to as a threshold voltage region and a threshold voltage implant respectively. The lightly-doped region 305 may be formed in accordance with the description of the lightly-doped region 205 in the previous embodiment.

Figure 3C:
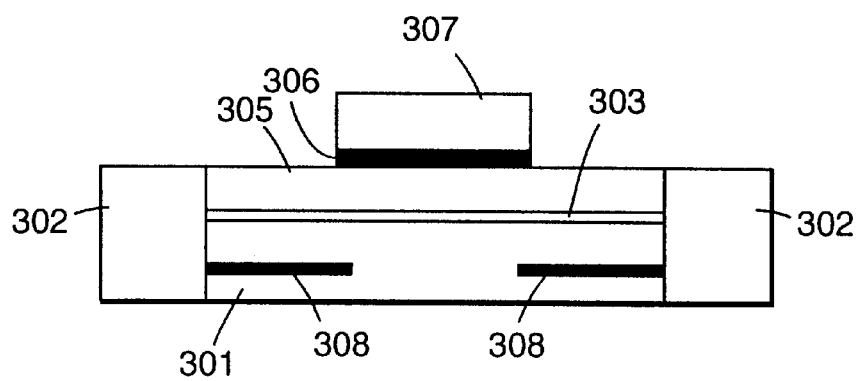

A gate electrode 307 is formed over the substrate 301, as illustrated in FIG. 3C. The gate electrode 307 is typically separated from the substrate 301 by a gate insulating layer 306. The gate electrode 307 and the gate insulating layer 306 may be formed using, for example, well-known techniques.

An oxygen-rich liner 308 is formed in the substrate 301 adjacent the gate electrode 307, as shown in FIG. 3C. The oxygen-rich liner 308 may, for example, be formed by implanting an oxygen-bearing species in the substrate 301. Suitable oxygen-bearing species include O and $O_2$, for example.

The oxygen-bearing species is generally implanted deeper into the substrate 301 than the oxygen-rich punchthrough region 303. The implant energy is chosen depending on the oxygen-bearing species and on the desired depth of the oxygen-rich liner 308. The oxygen-rich liner generally inhibits the active region dopants from diffusing deeper into the substrate 301, and in this manner defines the depth of the active regions 309. The oxygen-rich region depth and thickness are selected in consideration of the desired active region depth. Suitable depths of the oxygen-rich liner 308 range from about 0.1 to 0.12 microns. Suitable implant energies for oxygen range from about 100 to 500 keV for many applications. Suitable implant energies for an $O_2$ implant range from about 200 to 1,000 keV for many applications.

The concentration of the implanted oxygen-bearing species is chosen depending on the desired concentration of the oxygen-rich liner 308. An oxygen-bearing species may, for example, be implanted with a concentration ranging from about 5E13 to 5E15 atoms/cm. As discussed above, at these dosages the oxygen-rich region is typically a silicon dioxide region.

Figure 3D:
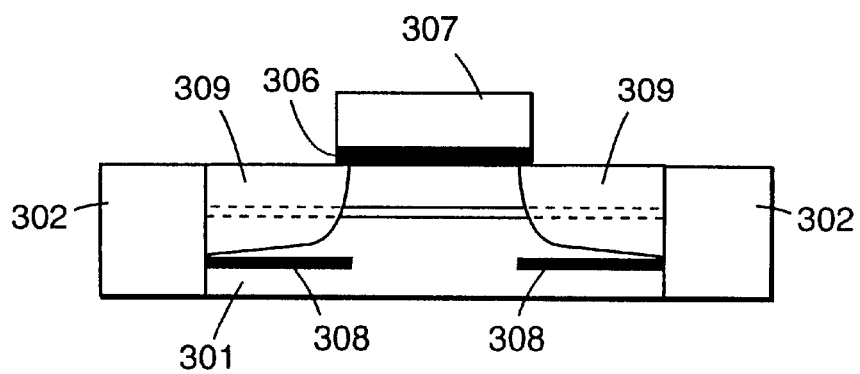

Active regions 309 are formed in the substrate 301, as illustrated in FIG. 3D. The active regions 309 may, for example, be LDD (lightly-doped-drain) source/drain regions. LDD source/drain regions may be formed in a similar manner as discussed above. After forming the active regions 309, the substrate 301 may be heated to activate the dopants in the active regions 309 and to drive the dopants deeper into the substrate 301. The substrate 301 may be heated using, e.g., well-known anneal techniques such as rapid thermal anneal (RTA).

During the anneal, the dopants in the active regions 309 as well as the channel dopants tend to diffuse further into the substrate 301. However, the oxygen-rich punchthrough region 303 and the oxygen-rich liner 308 will inhibit diffusion of dopants used in forming the channel region 205 and active regions 309 respectively. In particular, a silicon dioxide liner 308 provides a sharp junction depth. Fabrication of the semiconductor device may continue with well-known processing steps such as silicidation, contact formation, and so forth, to complete the device structure.

Using the above process, a semiconductor device can be fabricated having an oxygen-rich punchthrough region and an oxygen-rich liner beneath the active regions. The use of an oxygen-rich punchthrough region can, for example, inhibit the diffusion of dopants used to form the channel region and enhance the performance of the device. The use of an oxygen-rich liner can, for example, allow the sharp definition of active region junction depths and inhibit the flow of hot charge carriers between, for example, the drain and a grounded portion of the device.

The present invention is applicable to the fabrication of a number of different devices including, but not limited to, MOS, CMOS, and BiCMOS structures. It should be noted, therefore, that when fabricating a CMOS device, for example, it will be necessary to form different source/drain regions using both n-type and p-type dopants. Accordingly, the present invention cannot be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed, upon review of the present specification. The claims are intended to cover such modifications and devices.

What is claimed is:

1. A semiconductor device, comprising:

a substrate;

at least one oxygen-rich punchthrough region disposed in the substrate;

at least one channel region over the oxygen-rich punchthrough region; and isolation regions disposed in the substrate, the oxygen-rich punchthrough region extending between the isolation regions.

2. The semiconductor device of claim 1, wherein the oxygen-rich punchthrough region is disposed at a depth ranging from about 0.03 to 0.05 microns.

3. The semiconductor device of claim 1, further including a gate electrode over the substrate, the gate electrode substantially defining the channel region.

4. The semiconductor device of claim 3, further including active regions in the substrate adjacent the gate electrode.

5. The semiconductor device of claim 4, wherein the active regions are LDD source/drain regions.

6. The semiconductor device of claim 4, further including an oxygen-rich liner below the active regions, the active regions having a depth defined by the oxygen-rich liner.

7. The semiconductor device of claim 6, wherein the oxygen-rich liner is disposed at a depth ranging from about 0.1 to 0.12 microns.

8. The semiconductor device of claim 6, wherein the oxygen-rich liner includes two liners each beneath a respective active region, wherein the two liners are separated from one another beneath the channel region.

9. The semiconductor device, comprising:

a substrate;

a gate electrode disposed over the substrate;

active regions disposed in the substrate adjacent the gate electrode, each active region having a distal end away from the gate electrode;

a channel region disposed in the substrate, beneath the gate electrode and between the active regions; and an oxygen-rich region disposed beneath the channel region and extending between the distal ends of the active regions.

10. The semiconductor device of claim 9, wherein the active regions extend through the oxygen-rich region.

11. The semiconductor device of claim 9, wherein the active regions each have a junction depth within the oxygen-rich region.

12. The semiconductor device of claim 9, wherein the active regions each have a junction depth at about an interface of the oxygen-rich region.

13. The semiconductor device of claim 9, wherein the oxygen-rich region is a silicon dioxide region.

14. The semiconductor device of claim 9, further including an oxygen-rich liner beneath each active region, wherein the oxygen-rich liners are disposed deeper in the substrate than the oxygen-rich region and wherein the oxygen-rich liners are separated from one another by a portion of the substrate beneath the channel region.

15. The semiconductor device of claim 14, wherein the oxygen-rich liners are formed from oxide.

16. The semiconductor device of claim 15, wherein the oxygen-rich liners formed from oxide define junction depths of the active regions.

17. The semiconductor device of claim 9, further including at least two isolation regions in the substrate, the isolation regions defining an active area in which the active regions are formed, wherein the oxygen-rich region extends between the isolation regions.

18. The semiconductor device of claim 17, wherein the isolation regions are disposed adjacent the distal ends of the active regions.

19. The semiconductor device, comprising:

a substrate;

a gate electrode disposed over the substrate;

active regions disposed in the substrate adjacent the gate electrode, each active region having a distal end away from the gate electrode and a proximal end near the gate electrode;

a channel region disposed in the substrate, beneath the gate electrode and between the proximal ends of the active regions;

an oxygen-rich region disposed beneath the channel region and extending between the distal ends of the active regions; and a silicon dioxide liner disposed beneath each active region, wherein the liners are disposed deeper in the substrate than the oxygen-rich region and wherein the liners are separated from one another by a portion of the substrate beneath the channel region.

20. The semiconductor device of claim 19, wherein the liners define junction depths of the active regions.

* * * * *